United States Patent [19]

Rozzi et al.

[11] 4,376,307
[45] Mar. 8, 1983

[54] SEMICONDUCTOR LASER OR INTENSIFIER

[75] Inventors: Tullio E. Rozzi; Johannes H. C. Van Heuven, both of Eindhoven, Netherlands

[73] Assignee: U.S. Philips Corporation, New York, N.Y.

[21] Appl. No.: 150,270

[22] Filed: May 15, 1980

Related U.S. Application Data

[63] Continuation of Ser. No. 922,965, Jul. 10, 1978, abandoned.

[30] Foreign Application Priority Data

Jul. 12, 1977 [NL] Netherlands .................. 7707720

[51] Int. Cl.³ .............................................. H01S 3/19
[52] U.S. Cl. ..................................... 372/45; 330/4.3; 357/17; 372/46; 372/48
[58] Field of Search ............... 372/45, 46, 48; 357/17; 330/4.3

[56] References Cited

U.S. PATENT DOCUMENTS 3,978,428 8/1976 Burnham et al. ...................... 372/48
4,099,999 7/1978 Burnham et al. ...................... 372/48
4,121,179 10/1978 Chinone et al. ...................... 372/46
4,321,556 3/1982 Sakuma .................................. 372/45

OTHER PUBLICATIONS

D. R. Scifres et al., "Branching Waveguide Coupler in a GaAs/GaAlAs Injection Laser", *Appl. Phys. Lett.*, vol. 32, No. 10, May 15, 1978.

*Primary Examiner*—James W. Davie
*Attorney, Agent, or Firm*—Thomas A. Briody; Robert T. Mayer; Steven R. Biren

[57] ABSTRACT

A semiconductor laser or traveling wave intensifier has an active layer between two passive semiconductor layers, and a strip-shaped electrode geometry. The active layer is uniform in thickness, while at least one of the passive layers within the strip-shaped geometry comprises a strip-shaped zone which contains portions having different refractive indices $n_1$ and $n_2$. According to the invention it holds that $$(n_1 - n_2)(d_1 - d_2) > 0,$$

wherein $n_1$ is the refractive index of the portion which at least within said strip-shaped zone adjoins the active layer, $d_1$ is the thickness thereof within the strip-shaped zone, and $d_2$ is the thickness thereof beside the strip-shaped zone.

11 Claims, 14 Drawing Figures

SEMICONDUCTOR LASER OR INTENSIFIER

This is a continuation of application Ser. No. 922,965, filed July 10, 1978, now abandoned.

The invention relates to a semiconductor device for generating or intensifying coherent electro-magnetic radiation, comprising a semiconductor body having an active semiconductor layer which comprises a p-n junction and which is bounded on either side by first and second passive semiconductor layers having a lower refractive index for said radiation than the active layer, one of the passive layers comprising a strip-shaped electrode structure for supplying current to a strip-shaped region of the active layer in a direction substantially perpendicular to the layer so as to produce or intensify the said radiation therein, at least the first passive layer comprising a strip-shaped zone which, in projection, extends fully within the said strip-shaped region and which has a different structure from the parts of the said passive layer adjoining same, said strip-shaped zone having a width which is at most equal to that of the said strip-shaped region.

A prior art semiconductor device as described above is disclosed in U.S. Pat. No. 3,883,821.

It should be stressed that, where in this specification the expression "refractive index" is used, this relates to the real part of the (generally complex) refractive index for the relevant radiation.

The p-n junction may extend between two parts of the active layer parallel to the interfaces of the layer with the adjoining passive layers. However, the p-n junction may alternatively be formed between the active layer and one of the two passive layers adjoining same.

It is furthermore to be noted that the strip-shaped region of the active layer, while neglecting possible lateral spreading of the current, it is to be understood to mean herein that region of the active layer which in projection is bounded by the outline of the strip-shaped electrode structure.

Semiconductor devices for generating coherent electromagnetic radiation (lasers) or for the intensification (amplification) thereof (traveling wave intensifiers) are known in many constructions. The intensification occurs in a thin layer, the active layer of which, at least in the case of lasers, is partly situated within a resonant cavity which is formed either between two reflective surfaces extending perpendicular to the direction of propagation of the radiation, or, for example in the laser with reduced feedback coupling which is described in Applied Physics Letters, Vol. 18, Feb. 15, 1971, pp. 152–154.

The requirements which are imposed in many cases upon a laser intensifier of the said kind are:

(a) Low threshold current (that is the minimum current strength at which stimulated radiation emission and intensification, respectively, occur should be as low as possible);

(b) Beam cross-section which is as small as possible both in a direction perpendicular to the active layer and in a direction parallel thereto;

(c) Oscillation in only one mode, preferably the fundamental (lowest-order) transverse mode. In order to obtain a low threshold current and a small beam cross-section parallel to the active layer, the current, through a strip-shaped electrode structure, is limited to a narrow region of the active layer. The beam cross-section in a vertical direction, perpendicular to the active layer, is restricted by providing the active layer between two passive layers of lower refractive index (larger band gap) than the active layer. For this purpose, a passive semiconductor layer having a composition differing from that of the active layer is usually provided on one or on both sides of the active layer, said passive layer forming a so-called hetero junction with the active layer.

The number of transverse modes in which the emanating beam oscillates can be restricted by making the strip-shaped electrode configuration very narrow. In this manner the number of transverse modes can even be restricted to one. However, the use of very narrow electrode structures has for its disadvantage that the current density can easily become so high that damage to the laser structure occurs. In addition, several modes of oscillation may nevertheless occur in the case of currents which are considerably above the threshold current.

In the above device known from U.S. Pat. No. 3,883,821, the radiation is restricted to one transverse mode by making the active layer in a double hetero junction laser having a strip-shaped electrode not homogeneous in thickness but providing therein below the strip-shaped electrode a strip-shaped zone having a larger thickness than the remaining part of the active layer. By suitable choosing the ratio between the height and the width of the said thickened part of the active layer a radiation beam oscillating only in one transverse mode can be obtained.

However, a disadvantage of this known device is that technologically it is particularly difficult to provide the required very small and very narrow thickening in the active layer without thereby adversely influencing the operation of the laser/intensifier. First of all, the required processes (etching and growing after the etching step) are difficult to carry out in a reproducible manner while maintaining the required crystal perfection. In addition, the thin active layer within which the intensification mechanism of the device occurs, is the most vulnerable part of the device. Therefore, after providing the active layer said layer should be subjected to the least possible number of further treatments.

In addition to these technological problems several further disadvantages are associated with the known structure described above. For example, the thicker central region of the active layer underlying the strip-shaped electrode will pass less current and will hence become active less rapidly. This has a detrimental influence on stability of operation and on intensification. As a result of this, the threshold current is reached first in the thinner parts of the strip-shaped region of the active layer underlying the electrode on either side of the thickening. As a result of this, in principle first a higher mode and only then the fundamental mode can be impulsed upon switching on the device. And finally transverse higher-order modes in a direction perpendicular to the active layer can more easily occur in the thicker region of the active layer.

One of the objects of the invention is to provide a semiconductor device for generating or intensifying coherent radiation with strip-shaped electrode geometry, in which the emanating beam oscillates only in the fundamental transverse mode at current values above the threshold current, which device moreover can be manufactured with greater reproducibility than known devices.

For that purpose the invention is based inter alia on the recognition that wave guidance below the strip-shaped electrode can be obtained when an active layer is used which has substantially the same thickness and preferably the same doping everywhere, by means of measures which relate only to the construction and composition of a passive layer.

According to the invention, a semiconductor device of the kind described above is characterized in that the active layer has substantially the same thickness everywhere, that at least the first passive layer comprises a first portion having a refractive index $n_1$ and a second portion having a refractive index $n_2$ different from $n_1$ for the said radiation, said second portion being of the same semiconductor material and having the same conductivity type as the first portion, the active layer adjoining said first portion at least within said strip-shaped zone, and that the following condition is satisfied:

$$(n_1-n_2)(d_1-d_2)>0$$

wherein $d_1$ is the thickness of the first portion from the active layer to the second portion within the strip-shaped zone, and $d_2$ is the thickness of the first portion in the region of the first passive layer adjoining the strip-shaped zone.

The condition $(n_1-n_2)(d_1-d_2)>0$ indicates that either $n_1$ must be $>n_2$ and also $d_1$ must be $>d_2$ or $n_1$ must be $<n_2$ and also $d_1$ must be $<d_2$.

In the semiconductor device according to the invention, after the growth of the active layer said layer is not further subjected to treatments which might detrimentally influence the properties thereof, since the measures to obtain the desired wave guidance are restricted to the passive semiconductor layer or layers.

By making the strip-shaped zone narrower than the strip-shaped electrode structure, the operation of the laser (or intensifier) in the fundamental mode becomes more stable. According to an important preferred embodiment, therefore, the strip-shaped zone has a width less than said strip-shaped region of the active layer. Since the electrode width need not be extremely small, a comparatively large power level can be generated without degradation of the device. Furthermore, the emanating beam in this case has a satisfactorily flat wave front so that the beam is only slightly astigmatic, which makes optical coupling to, for example, a glass fiber simple.

Although higher transverse oscillation modes can be suppressed to a considerable extent when the strip-shaped zone of higher refractive index is provided so as to be slightly asymmetrical with respect to the electrode structure, the occurrence of more than one oscillation mode can be suppressed to a much greater extent in the case of a symmetrical structure. Therefore, according to an important preferred embodiment, the strip-shaped zone is provided so as to be symmetrical with respect to the strip-shaped region.

The strip-shaped zone can be realized in a number of different manners in the structure of the first passive semiconductor layer. According to an important preferred embodiment, the first passive semiconductor layer in the regions adjoining the strip-shaped zone consists entirely of the portion having the lower refractive index. In this case, during manufacture the starting point is a first passive semiconductor layer having a homogeneous composition, after which the desired zone can be formed in a comparatively simple manner technologically by doping a narrow strip-shaped part of said layer. This may be done, for example, by diffusion or by ion implantation, in which a passive layer which consists, for example, of a ternary semiconductor mixed crystal, for example $Ga_{1-x}Al_xAs$, is locally given a slightly different composition having a higher refractive index by a suitable doping.

In this manner a strip-shaped zone of higher refractive index can simply be formed which extends from the surface of the first passive semiconductor layer remote from the active layer over a part of the thickness of the layer, in which latter case the strip-shaped zone consists entirely of the portion having the higher refractive index. When ion implantation is used, a "buried" strip-shaped zone of higher refractive index can also be obtained in a simple manner in the first passive semiconductor layer which is surrounded, within the passive semiconductor layer, entirely by the portion having the lower refractive index.

All the above-mentioned preferred embodiments have the advantage of being realizable technologically in a comparatively simple manner.

The active and passive layers need not be flat and in some cases it may be preferred, also in connection with the manufacturing method to be followed, to provide one or more layers so as to be not flat and one or both passive layers to have an inhomogeneous thickness. A preferred embodiment in which the active layer in the strip-shaped zone adjoins the material having the lower refractive index (so $n_1<n_2$ and $d_1<d_2$) is characterized in that the first passive layer is provided on a substrate which locally has a strip-shaped raised portion, the first passive layer at the area of said raised portion showing a smaller overall thickness than beside the raised portion. Conversely, a preferred embodiment in which the active layer in the strip-shaped zone adjoins the material having the higher refractive index (so $n_1>n_2$ and $d_1>d_2$) is characterized in that the first passive layer is provided on a substrate which locally has a strip-shaped depressed portion, the first passive layer at the area of said depressed portion showing a larger overall thickness than beside the depressed portion.

As regards the strip-shaped electrode structure, several known configurations may be used which may be situated either on one side or on the other side of the active layer, or theoretically on both sides, although this may cause cooling problems.

The invention will now be described in greater detail with reference to various embodiments and the drawing, in which.

The figures are diagrammatic, and not drawn to scale, for clarity. In the cross-sectional views, regions of the same conductivity type are as a rule shaded in the same direction. Corresponding parts are generally referred to by the same reference numerals.

Figure 1:
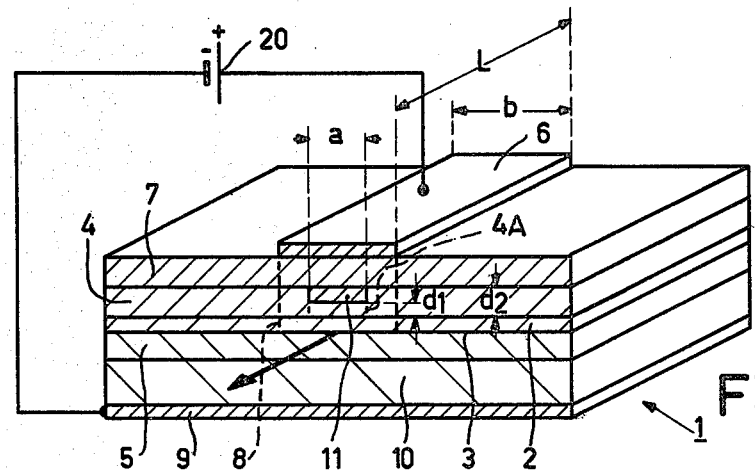
FIG. 1 is a partly perspective and partly diagrammatic cross-sectional view of a device according to the invention.
Figure 2:
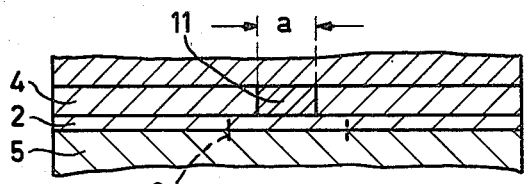
FIGS. 2 to 6 are diagrammatic cross-sectional views through the active parts of modified embodiments of devices according to the invention.

FIG. 1 shows partly as a perspective view and partly as a cross-sectional view a semiconductor device according to the invention for intensifying or generating coherent electromagnetic radiation. The device comprises a semiconductor body 1 having an active semiconductor layer 2 which comprises a p-n junction 3 and is bounded on either side by first and second passive semiconductor layers (4, 11) and 5 both having a lower refractive index for the radiation to be generated or intensified than the active layer 2. One of the passive layers, the layer (4, 11) has a strip-shaped electrode structure. In this example this is a strip-shaped metal layer 6 which is provided on a semiconductor contact layer 7 having the same conductivity type as but a lower resistivity than the passive layer (4, 11). Current can be supplied to a strip-shaped region 8 (situated between the broken lines) of the active layer 2 by the electrode 6 in a direction perpendicular to the layer. The other electrode (9) is situated on a readily conductive substrate 10, on which the passive layer 5 is present, and extends on the whole surface thereof. By applying a suitable voltage between the electrodes 6 and 9 via a current source 20, shown diagrammatically in FIG. 1, current is supplied to the region 8 in a direction substantially perpendicular to the layer 2, namely in the forward direction of the p-n junction 3, which current serves in known manner to generate in the active layer 2 coherent electromagnetic radiation according to the laser principle (if the strip-shaped region 8 is provided in a resonant cavity) or to intensify it (if this is not the case).

The first passive layer (4, 11) has a strip-shaped zone (4A, 11) extending in projection entirely within the strip-shaped region 8 and having a different structure than the adjoining parts (4) of the layer as will be described in detail hereinafter. Said strip-shaped zone (4A, 11) has a width which is at most equal to, and in this example is smaller than, that of the strip-shaped region 8.

According to the invention the active layer (2) everywhere has about the same thickness, while at least the first passive layer comprises a first portion (4, 4A) having a refractive index $n_1$, and a second portion 11 of the same semiconductor material and the same conductivity type as the first portion and having a refractive index $n_2$ for said radiation which is different from $n_1$. The active layer 2, at least within the strip-shaped zone (4A, 11) (and in this example also outside the strip-shaped zone) adjoins the first portion (4, 4A). In this example $n_2 > n_1$, while the thickness $d_1$ of the first portion 4A from the active layer 2 to the second portion 11 within the strip-shaped zone (4A, 11) is less than the thickness $d_2$ of the first portion 4 in the region of the first passive layer which adjoins the strip-shaped zone.

Since $n_2 > n_1$ and $d_2 > d_1$, the condition is satisfied that $(n_1 - n_2)(d_1 - d_2) > 0$.

The dimensions and compositions of the various layers are as follows:

Substrate 10:
  n-type gallium arsenide (GaAs); thickness approximately 80 microns; refractive index approximately 3.61; resistivity approximately 0.001 Ohm.cm.

Passive layer 5:
  n-type gallium aluminum arsenide ($Ga_{0.7}Al_{0.3}As$); thickness approximately 3 microns; refractive index approximately 3.40.

Active layer 2:
  p-type GaAs; thickness approximately 0.5 micron; refractive index approximately 3.61.

Passive layer 4:
  Outside the zone 11: p-type $Ga_{0.7}Al_{0.3}As$; thickness approximately 1.5 microns; refractive index approximately 3.40.

Zone 11:
  p-type $Ga_{0.7}Al_{0.3}As$, $d_1$ (FIG. 1)=0.1 micron; refractive index approximately 3.41.

Contact layer 7:
  p-type GaAs; thickness approximately 1.5 microns; refractive index approximately 3.61; respectively approximately 0.003 Ohm. cm.

Width b of electrode layer 6: approximately 9 microns.

The device may operate as a laser or as a traveling wave intensifier. When used as a laser, for example reflective surfaces are provided in the usual manner perpendicular to the strip-shaped electrode 6; for this purpose, for example, the end faces of the crystal may be used, which surfaces are then constructed as cleavage surfaces, or periodic structures as described in the above-mentioned article in Applied Physics Letters may be used. The generated laser radiation in the device described then has a wavelength (in vacuum) of approximately 0.9 micron and emanates in the direction of the arrow in FIG. 1.

When used as a traveling wave intensifier, no reflective surfaces are used; the emanating radiation emanates in the direction of the arrow in FIG. 1, and the entering radiation enters in the same direction through the oppositely located end face, the emanating radiation of wavelength 0.9 micron being intensified with respect to the entering radiation of the same wavelength.

In both applications, with the device described, for different widths a in microns of the strip-shaped zone (see FIG. 1) the following results are calculated for $d_1 = 0.1$ micron:

TABLE I

| A. i = 3kA/cm² $d_1 = 0.1$ μm | | | | B. i = 4kA/cm² | | | |
|---|---|---|---|---|---|---|---|
| a | R.I. | H.C. | R.A. | a | R.I | H.C. | R.A. |
| 0 μm | 1 | 0.240 | 1 | 0 μm | 1 | 0.415 | 1 |
| 2 | 1.049 | 0.096 | 0.853 | 2 | 1.057 | 0.136 | 0.893 |
| 4 | 1.085 | 0.252 | 0.728 | 4 | 1.100 | 0.308 | 0.775 |
| 6 | 1.107 | 0.414 | 0.632 | 6 | 1.126 | 0.469 | 0.714 |
| 8 | 1.118 | 0.551 | 0.568 | 8 | 1.138 | 0.598 | 0.661 |
| 8.5 | 1.119 | 0.580 | 0.557 | 8.5 | 1.1386 | 0.624 | 0.652 |
| 9 | 1.120 | 0.607 | 0.548 | 9 | 1.1388 | 0.649 | 0.645 |
| 10 | 1.121 | 0.610 | 0.535 | 10 | 1.137 | 0.646 | 0.637 |

The indicated values apply to a strip length L (see FIG. 1) of 300 microns with the given current densities in kA/cm².

R.I. = relative power intensification =
$$\frac{\text{(intensification with zone 11)}}{\text{(intensification without zone 11)}}$$

H.C. = horizontal concentration =
$$\frac{\text{(power in strip-shaped region 8)}}{\text{(total power)}}$$

Figure 3:
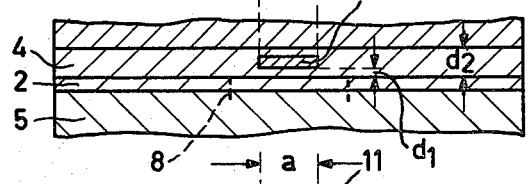

R.A. = relative astigmatism =
$$\frac{\text{(relative phase of the field on the edge of region 8 with zone 11)}}{\text{(relative phase of the field on the edge of region 8 without zone 11)}}$$

in which the relative phase is, for example, chosen with respect to the phase in the center of the strip-shaped region 8. Many modifications of the embodiment shown in FIG. 1 are possible; the principal modifications are shown in FIGS. 2 to 6 as cross-sectional views in so far as the layers 4, 2 and 5 are concerned. 11 is always the region having the higher refractive index, while the remaining part of the layer 4 has a lower refractive index. The strip-shaped zone in all these cases is provided symmetrically with respect to the strip-shaped region 8. In the devices shown in FIGS. 1, 2 and 3 the passive layer 4 in the regions adjoining the strip-shaped zone consists entirely of the material of lower refractive index, the strip-shaped zone of the layer 4 in FIG. 2 consisting entirely of the material of the higher refractive index, in other words the zone 11 extends over the whole thickness of the layer 4. In FIG. 3 the portion 11 of higher refractive index is surrounded entirely by the portion 4 of lower refractive index.

Figure 4:
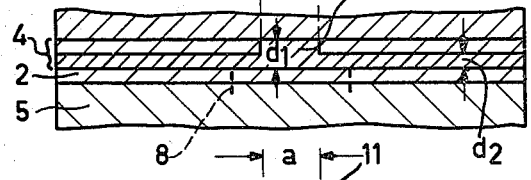
Figure 5:
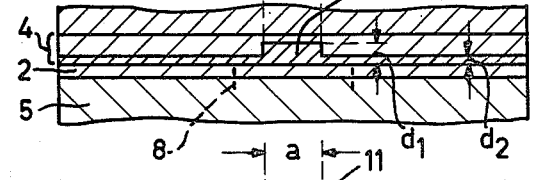
Figure 6:
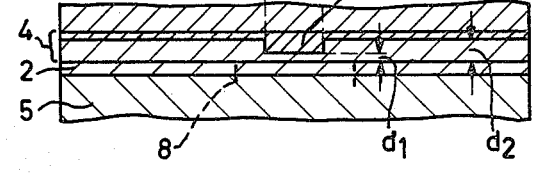

In FIGS. 4 to 6 the region 11 also has a higher refractive index than the remainder of the layer (4, 11). In the devices shown in FIGS. 4 and 5 the region 11 adjoins the active layer 2; so in these devices it holds that $n_1 > n_2$ and $d_1 > d_2$. In the device shown in FIG. 6 where the region of lower refractive index adjoins the active layer 2, it holds on the contrary that $n_1 < n_2$ and $d_1 < d_2$.

For the devices shown in FIGS. 2 to 6 the same results hold to an approximation as indicated in Table 1 for the device shown in FIG. 1. For example, the results shown in Table II are obtained for the device shown in FIG. 2.

TABLE II

| A. i = 3kA/cm² | | | | B. i = 4kA/cm² | | | |
| d₁ = 0 μm | | | | | | | |
| a | R.I. | H.C. | R.A. | a | R.I. | H.C. | R.A. |
| 0 μm | 1 | 0.241 | 1 | 0 μm | 1 | 0.415 | 1 |
| 2 | 1.154 | 0.237 | 0.514 | 2 | 1.203 | 0.251 | 0.600 |
| 4 | 1.198 | 0.551 | 0.324 | 4 | 1.278 | 0.558 | 0.398 |
| 6 | 1.207 | 0.739 | 0.251 | 6 | 1.296 | 0.743 | 0.313 |
| 8 | 1.206 | 0.840 | 0.226 | 8 | 1.292 | 0.843 | 0.284 |
| 9 | 1.202 | 0.872 | 0.228 | 9 | 1.284 | 0.874 | 0.288 | in which the abbreviations have the same meaning as in Table I.

From the above it appears that devices according to the invention, both as regards relative power intensification and as regards horizontal concentration and relative astigmatism, shows a considerable improvement as compared with devices in which the passive layer 4 is homogeneous in thickness and composition and in which thus the region 11 is lacking. Also for the above-mentioned reasons, the present devices are more easily fabricated than those described in U.S. Pat. No. 3,883,821, since the active layer 2 has substantially the same thickness everywhere and mechanical or physical-chemical treatments need not be carried out on or in said layer after the growth thereof.

It should be stressed that both in Table I B. (for a ≈9 μm) and in Table II A. (for a ≈6 μm) and in Table II B. (for a ≈6 μm) there is an optimum value for R.I.; in Table I B. this is the case for H.C. as well. In the calculation of these values, losses at the edge of the strip-shaped active laser region have not been taken into account. If these losses are taken into account in a more complicated calculation, the resulting values are slightly different and one finds that there is always an optimum value which occurs for values of a which are in the order of the width b of the said strip-shaped region of the layer 2.

Figure 7:
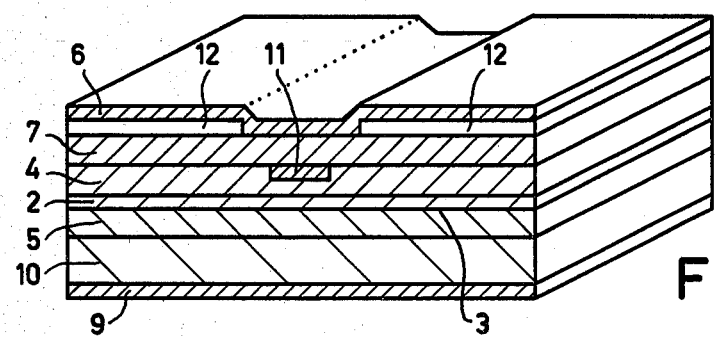
FIGS. 7 to 11 are diagrammatic cross-sectional views of the device shown in FIG. 1 with different strip-shaped electrode structures.
Figure 8:
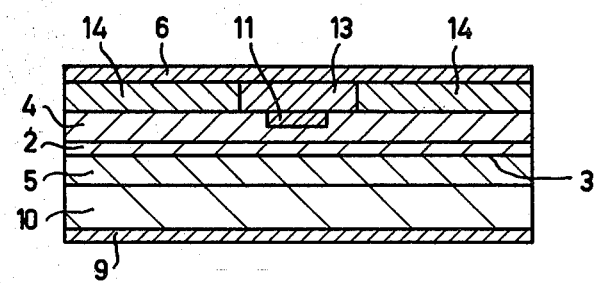
Figure 9:
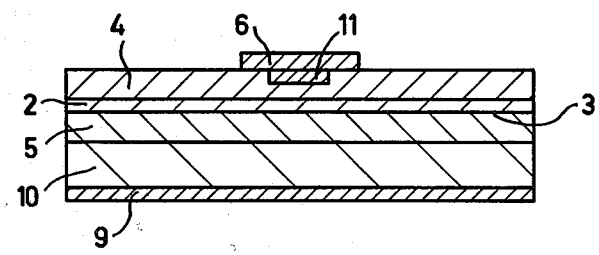
Figure 10:
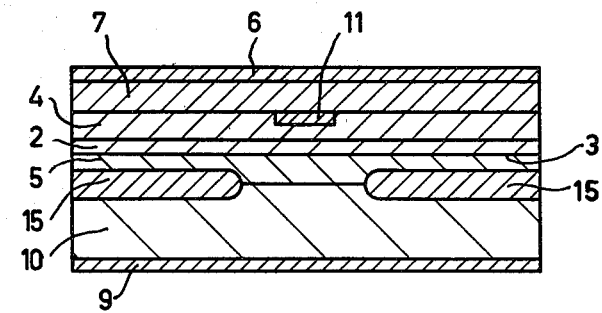
Figure 11:
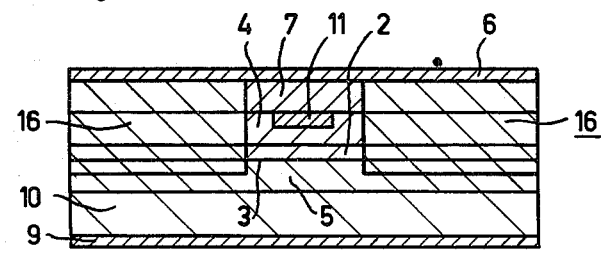

FIGS. 7 to 11 show various embodiments for the strip-shaped electrode structure which are all known per se. They may be used in the structure shown in FIG. 1, as shown in the drawing, but also in any other device according to the invention. In FIG. 7, an electrode layer is provided on the upper side of the device over the whole surface, which layer, however, contacts the semiconductor surface only via a slot-shaped aperture in the insulating layer 12 situated on the surface. In FIG. 8, a contact layer is provided on the p-conductive passive layer 4 and consists of a strip-shaped part 13 of p-type gallium arsenide and beside it n-type gallium arsenide regions 14, so that in the forward direction current flows only through the p-n junction 3 via the region 13. In FIG. 9 a strip-shaped electrode 6 is provided directly on the passive layer 4. In FIG. 10 the strip-shaped electrode structure is provided in contact with the passive layer 5 by restricting the current to a strip-shaped region by means of the buried p-type GaAs regions 15 between the n-type GaAlAs layer 5 and the n-type GaAs substrate 10. in FIG. 11 the current is restricted to a strip-shaped region by providing insulating zones 16, for example, by a proton bombardment.

In the devices described so far, all the successive layers were bounded by substantially flat surfaces. That this is not necessary is illustrated with reference to the examples of FIGS. 12 and 13. For clarity, these figures only show the small active part of the device as diagrammatic cross-sectional view perpendicular to the strip-shaped configuration.

Figure 12:
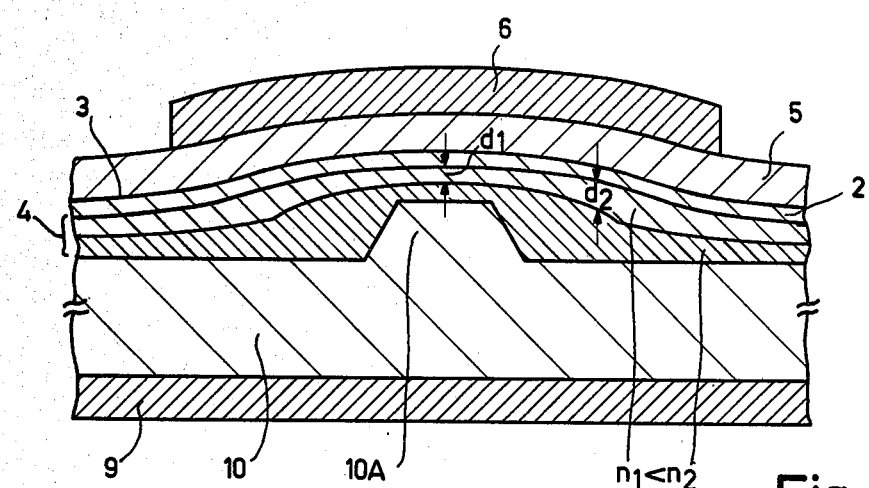
FIGS. 12 and 13 are diagrammatic cross-sectional views of the active parts of two other modified embodiments of the device according to the invention.

In the device shown in FIG. 12 the first passive layer 4, that is, the passive layer comprising the strip-shaped zone according to the invention, is provided on a substrate 10 which locally has a strip-shaped raised portion 10A, in which the first passive layer 4 at the area of said raised portion shows a smaller overall thickness than beside the raised portion. In the structure shown in FIG. 12 the electrode 6 again has a width of approximately 9 microns, the raised portion 10A has a width of approximately 4 microns and a height of approximately 2 microns, and the lowermost portion of the passive layer 4 consists of n-type $Ga_{1-x}Al_xAs$ having such a composition that its refractive index $n_2$ is approximately 3.50, while the uppermost portion of the layer 4 adjoining the active layer 2 consists of n-type $Ga_{1-y}Al_yAs$ having such a composition that its refractive index $n_1$ is approximately 3.40. The passive layer 5 also has a refractive index 3.40. The thickness $d_1$ is approximately 0.4 micron, the thickness $d_2$ at the indicated place is approximately 0.8 micron. The thickness of the active layer 2 (n-type GaAs, refractive index approximately 3.61) is approximately 0.2 micron everywhere, that of the passive layer 5 (p-type $Ga_{1-x}Al_yAs$) is approximately 1.5 microns. An electrode layer 9 is provided on the substrate 10 consisting of n-type GaAs and having a low resistivity and refractive index 3.61.

Figure 13:
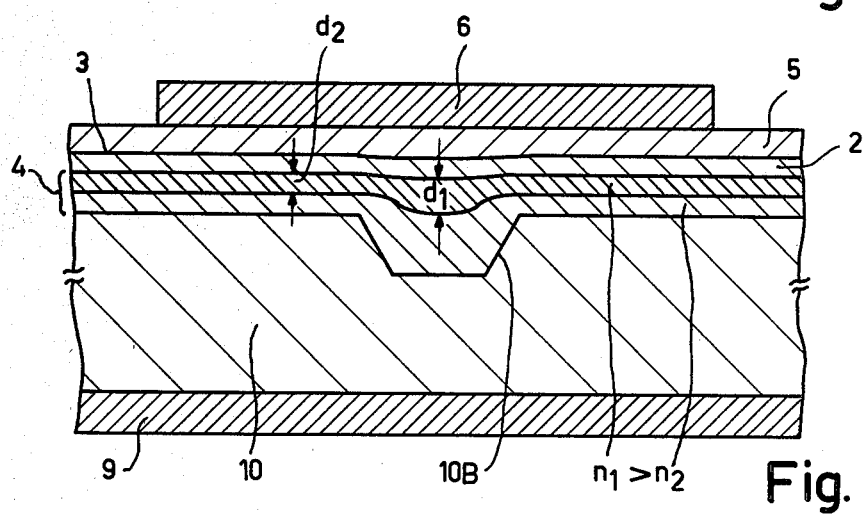
Figure 14:
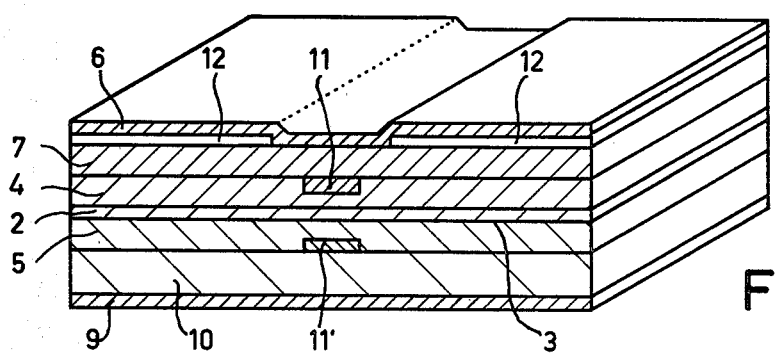
FIG. 14 is a diagrammatic cross-sectional view of a modified embodiment of the device shown in FIG. 7.

Conversely, a laser or intensifier structure as shown in FIG. 13 may also be obtained. In this figure the first passive layer 4 is provided on a substrate 10 which locally shows a strip-shaped depressed portion 10B in which the layer 4 at the area of said depressed portion shows a larger overall thickness than beside the depressed portion. The depressed portion 10B has a width of approximately 4 microns and a height of approximately 3 microns. The layer 4 consists of a lowermost portion of n-type $Ga_{1-y}Al_yAs$ having a refractive index $n_2 = 3.40$, and an uppermost portion of n-type $Ga_{1-x}Al_xAs$ having a refractive index $n_1 = 3.50$ and adjoining the active layer 2. The regions and layers 10, 2 and 5, for example, have the same thickness and composition as in FIG. 12. The thickness $d_1$ is approximately 0.25 micron, the thickness $d_2$ is approximately 0.1 micron. As in the example of FIG. 12, it now also holds that $$(n_1-n_2)(d_1-d_2)>0.$$

Both in the device shown in FIG. 12 and in that shown in FIG. 13 the active layer 2 has substantially the same thickness everywhere. The devices shown in FIGS. 12 and 13 may be manufactured, for example, by using epitaxial growth methods as described in Journal of Applied Physics, Volume 47, No. 10, October 1976, pp. 4578-4589. In these methods use is made of the fact that upon depositing an epitaxial layer from the liquid phase on a substrate having an unevenness, the layer grows thinner on a raised portion and grows thicker in a depressed portion than beside it, in which thus in both cases a certain "equalization effect" occurs. As the unevenness on which the layer is grown becomes less pronounced, the grown layer becomes more uniform in thickness. In addition, gallium arsenide proves to demonstrate the effect to a smaller extent than does aluminum arsenide. As a result of this, both in the structure of FIG. 12 and in that of FIG. 13 an active layer 2 of gallium arsenide of substantially uniform thickness can be grown on the passive layer 4 of gallium aluminum arsenide.

In this manner, by starting from the substrates in question, the desired structure is obtained both in FIG. 12 and in FIG. 13 by direct epitaxial growth of the successive layers from the liquid phase without it being necessary to carry out further operations after the growth of the layer 4 thereon so as to obtain the desired strip-shaped inhomogeneity.

The successive epitaxial growth of semiconductor layers of different compositions is generally known in the technology of the hetero junction lasers and is described in detail in the technical literature on various occasions. In this connection reference may be had to the book by D. Elwell and J. J. Scheel, Crystal Growth from High Temperature Solutions, Academic Press 1975, pp. 433-467, hereby incorporated by reference. Accordingly, the manufacture of the devices described herein need not be further detailed. The portions of different refractive indices in the passive layer 4 (FIGS. 1 to 11) can be obtained by first growing a layer of homogeneous refractive index and then introducing into a portion of said layer, while using a suitable masking, a material which increases the refractive index (FIGS. 1 to 3, 6 to 11) or a material which reduces the refractive index (FIGS. 4 and 5), for example, by diffusion or by ion implantation. As a result of this the forbidden bandgap of the layer is locally reduced (so as to increase the refractive index) or increased (so as to reduce the refractive index). For example, the refractive index can be increased in p-type $Ga_{1-x}Al_xAs$ by increasing the content of gallium. Conversely the refractive index can be reduced by increasing the content of aluminum.

The invention is not restricted to the embodiments described. For example, suitable semiconductor materials other than GaAs and $Ga_{1-x}Al_xAs$ may alternatively be used. Furthermore, the conductivity type of the active layer is not of essential importance; in the embodiments described the layer 3 may be both p-conductive and p-conductive. Alternatively, a portion of the layer 2 may be n-conductive and a portion may be p-conductive, said portions constituting a p-n junction parallel to the faces of the layer 2.

It is furthermore of importance to note that a strip-shaped zone of different construction which in the embodiments described occurs only in the first passive layer 4, may be provided, if desired, both in the first passive layer 4 and in the second passive layer 5. The structures of said two zones need not be the same; for example, a region 11 in the layer 4 of FIG. 2 may be combined with a region 11' according to one of the structures of FIGS. 3 to 6 in the layer 5. FIG. 4 serves as an illustration in which an n-type region 11' of higher refractive index than the remainder of the layer 5 is provided in the n-type passive layer 4 and the reference numerals otherwise have the same meaning as in FIG. 7. In this case the strip-shaped zones in the layers 4 and 5 have the same construction and it can be calculated that to an approximation double the effect occurs with respect to the device shown in FIG. 7.

The strip-shaped electrode structure may be situated at the side of the layer 4, or alternatively, at the side of the layer 5.

Finally, it is to be noted that, although the invention has been described with reference to embodiments relating to lasers or intensifiers having hetero junctions, the invention may in principle also be applied to lasers or intensifiers which are constructed from a semiconductor body which is built up entirely of the same semiconductor material and the same semiconductor compound, respectively, without showing hetero junctions between different semiconductor materials.

What is claimed is:

1. A semiconductor device for operation with coherent electromagnetic radiation, comprising a semiconductor body having an active semiconductor layer which comprises a p-n junction and which is bounded on either side by first and second passive semiconductor layers having a lower refractive index for said radiation than the active layer, means for supplying current to a strip-shaped region of the active layer in a direction substantially perpendicular to the layer, at least a selected one of said passive layers comprising a strip-shaped zone, the projection of said zone onto said strip-shaped region of the active layer extending fully within said strip-shaped region and said zone having a different structure from that of the adjacent parts of said selected passive layer, said strip-shaped zone having a width which is at most equal to that of said strip-shaped region of the active layer, the active layer having a substantially constant thickness, at least said selected passive layer comprising a first portion having a refractive index $n_1$ and a second portion having a refractive index $n_2$ different from $n_1$ for said radiation, said second portion having the same conductivity type as the first portion, the active layer adjoining said first portion at least within said strip-shaped zone, and said device satisfying the condition $$(n_1-n_2)(d_1-d_2)>0,$$

wherein $d_1$ is the thickness of that part of the first portion measured from the active layer to the closest part of the second portion within the strip-shaped zone, and $d_2$ is the thickness of the first portion in the region of said selected passive layer adjoining and outside the strip-shaped zone.

2. A semiconductor device as claimed in claim 1, wherein the strip-shaped zone has a width less than that of said strip-shaped region of the active layer.

3. A semiconductor device as claimed in claim 1 wherein the strip-shaped zone is symmetrically located with respect to the strip-shaped region.

4. A semiconductor device as claimed in claim 1, wherein said selected passive semiconductor layer in the regions adjoining the strip-shaped zone consists entirely of the portion having the lower refractive index.

5. A semiconductor device as claimed in claim 1, wherein the portion having the higher refractive index extends within the strip-shaped zone from the surface of said selected passive semiconductor layer remote from the active layer over at least a part of the thickness of said layer.

6. A semiconductor device as claimed in claim 4 or 5, wherein the strip-shaped zone consists entirely of the material having the higher refractive index.

7. A semiconductor device as claimed in claim 4, wherein the strip-shaped zone comprises a region of the portion having the higher refractive index and is surrounded entirely by the portion having the lower refractive index.

8. A semiconductor device as claimed in claim 1 in which $n_1 < n_2$ and $d_1 < d_2$, wherein said selected passive layer is provided on a substrate which locally has a strip-shaped raised portion, said selected passive layer having a smaller overall thickness at the area of said raised portion than beside the raised portion.

9. A semiconductor device as claimed in claim 1 in which $n_1 > n_2$ and $d_1 > d_2$, wherein said selected passive layer is provided on a substrate which locally has a strip-shaped depressed portion, said selected passive layer having a larger overall thickness at the area of said depressed portion than beside the depressed portion.

10. A semiconductor device as claimed in claim 1, wherein each of said passive layers comprises two portions having different refractive indices and strip-shaped zones are provided in each of said passive layers.

11. A semiconductor device as claimed in claim 5, wherein said selected passive layer within the strip-shaped zone consists of the layer portion having the higher refractive index, and said selected passive layer in the regions adjoining the strip-shaped zone comprises the layer portion having the higher refractive index in the region adjacent said active layer and comprises the layer portion having the lower refractive index in the remainder of the layer.

* * * * *